United States Patent
Sasaki et al.

(10) Patent No.: US 10,495,978 B2
(45) Date of Patent: Dec. 3, 2019

(54) PROJECTION OPTICAL SYSTEM, EXPOSURE APPARATUS, AND DEVICE MANUFACTURING METHOD

(71) Applicant: CANON KABUSHIKI KAISHA, Tokyo (JP)

(72) Inventors: Yasuhito Sasaki, Saitama (JP); Mitsuru Seki, Chikusei (JP); Takeshi Nakajima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/526,277

(22) PCT Filed: Nov. 17, 2015

(86) PCT No.: PCT/JP2015/005744
§ 371 (c)(1),
(2) Date: May 11, 2017

(87) PCT Pub. No.: WO2016/088314
PCT Pub. Date: Jun. 9, 2016

(65) Prior Publication Data
US 2017/0315448 A1  Nov. 2, 2017

(30) Foreign Application Priority Data
Dec. 2, 2014 (JP) ................. 2014-244333

(51) Int. Cl.
*G03B 27/42* (2006.01)
*G03F 7/20* (2006.01)
(Continued)

(52) U.S. Cl.
CPC ......... *G03F 7/702* (2013.01); *G02B 17/0605* (2013.01); *G02B 17/0615* (2013.01);
(Continued)

(58) Field of Classification Search
CPC .... G03B 21/28; G03B 21/142; G03B 21/147; G03B 21/145; G03B 21/10; G03B 21/00;
(Continued)

(56) References Cited

U.S. PATENT DOCUMENTS

2006/0092393 A1  5/2006  Harmed et al.
2008/0252871 A1  10/2008  Sato et al.

FOREIGN PATENT DOCUMENTS

CN  1704797 A  12/2005
CN  101286012 A  10/2008
(Continued)

*Primary Examiner* — Mesfin T Asfaw
(74) *Attorney, Agent, or Firm* — Canon U.S.A. Inc., IP Division (57) ABSTRACT

There is provided a projection optical system that projects an image of an object onto an image plane. The projection optical system includes an imaging optical system including a first concave mirror, a convex mirror, and a second concave mirror; an optical member having a first reflecting surface and a second reflecting surface each redirecting an optical path; and a supporting member that supports the convex mirror. The first reflecting surface, the first concave mirror, the convex mirror, the second concave mirror, and the second reflecting surface are provided in that order in a direction of travel of light from an object plane. The optical member has a through hole having an opening on a side facing the convex mirror. The supporting member extends through the through hole and from the opening to the convex mirror.

15 Claims, 11 Drawing Sheets

(51) Int. Cl.
*G02B 17/06* (2006.01)
*G03B 21/28* (2006.01)

(52) U.S. Cl.
CPC ............. *G03B 21/28* (2013.01); *G03F 7/709* (2013.01); *G03F 7/70233* (2013.01)

(58) Field of Classification Search
CPC .. G03F 7/702; G03F 7/70233; G03F 7/70825; G03F 7/20; G03F 7/7025; G03F 7/70258; G03F 7/70275; G02B 17/08; G02B 5/09; G02B 5/04; G02B 5/10; G02B 27/0043; G02B 27/098
See application file for complete search history.

(56) References Cited

FOREIGN PATENT DOCUMENTS

| | | |
|---|---|---|
| CN | 103454769 A | 12/2013 |
| JP | H06-89844 A | 3/1994 |
| JP | 2001-326160 A | 11/2001 |
| JP | 2005-345582 A | 12/2005 |
| JP | 2010-020017 A | 1/2010 |
| JP | 2011-082311 A | 4/2011 |
| JP | 2011-108793 A | 6/2011 |
| JP | 2014-103171 A | 6/2014 |
| JP | 5595015 B2 | 9/2014 |
| KR | 10-2010-0129685 A | 12/2010 |
| TW | 200935188 A | 8/2009 |
| TW | 201350902 A | 12/2013 |

PROJECTION OPTICAL SYSTEM, EXPOSURE APPARATUS, AND DEVICE MANUFACTURING METHOD

TECHNICAL FIELD

The present invention relates to a projection optical system, an exposure apparatus, and a device manufacturing method.

BACKGROUND ART

Figure 9:
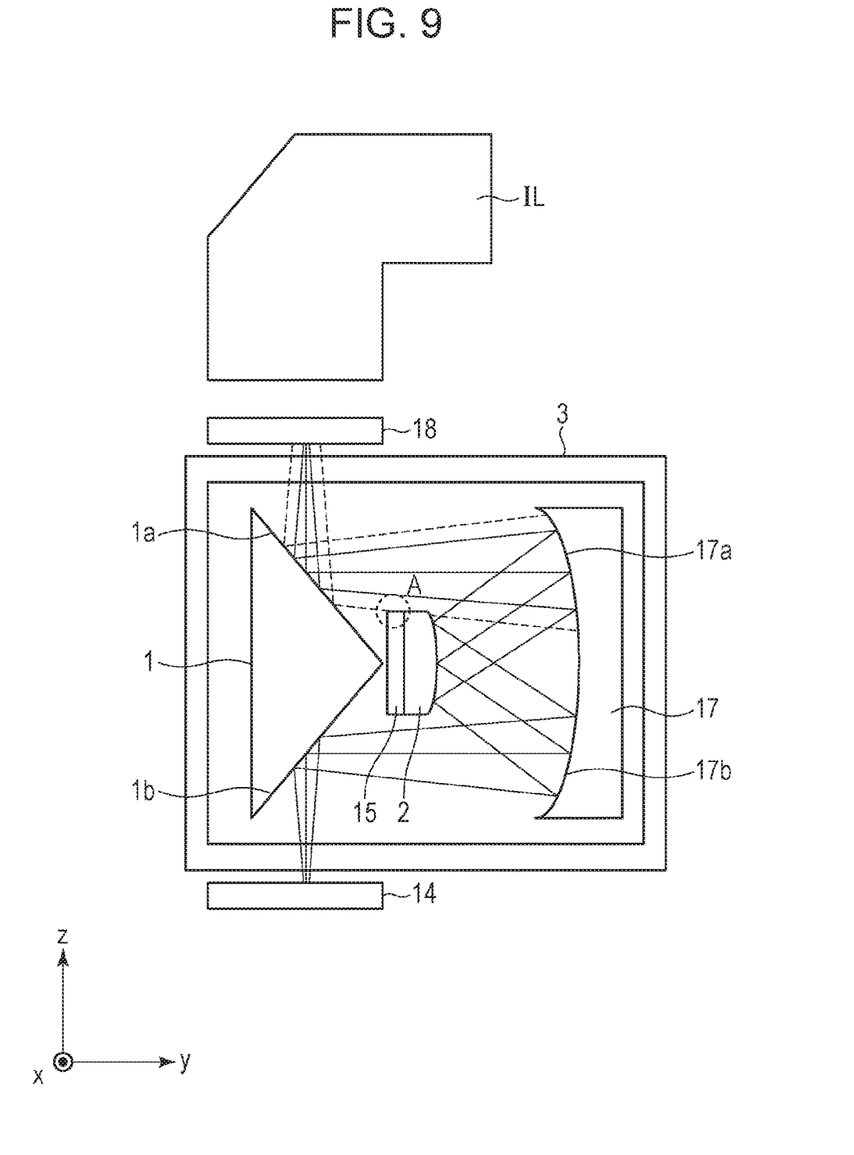
FIG. 9 is a schematic diagram of an exposure apparatus according to a related art.

Liquid crystal panels intended for flat panel displays (FPDs) are manufactured by using exposure apparatuses. In an exposure apparatus, an image of a pattern drawn on a mask is projected onto a glass substrate to which photoresist has been applied, and the glass substrate is exposed to light. Such an exposure apparatus is disclosed by PTL 1. FIG. 9 is a schematic diagram of an exposure apparatus according to a related art. The exposure apparatus includes an illumination optical system IL that illuminates a mask 18, and a projection optical system that projects a pattern drawn on the mask 18 onto a substrate 14. The projection optical system includes polygonal optical member 1 having a first reflecting surface 1a and a second reflecting surface 1b, a concave mirror 17 having a first concave reflecting surface 17a and a second concave reflecting surface 17b, and a convex mirror 2. Furthermore, the projection optical system includes a lens barrel 3 that houses the above mirrors. Light emitted from the illumination optical system IL in the −z direction is transmitted through the mask 18 and is redirected in the +y direction by the first reflecting surface 1a of the polygonal optical member 1, which is provided below the mask 18. The light redirected by the first reflecting surface 1a of the polygonal optical member 1 is reflected by the first concave reflecting surface 17a, the convex mirror 2, the second concave reflecting surface 17b, and the second reflecting surface 1b in that order and falls onto the substrate 14.

Figure 10:
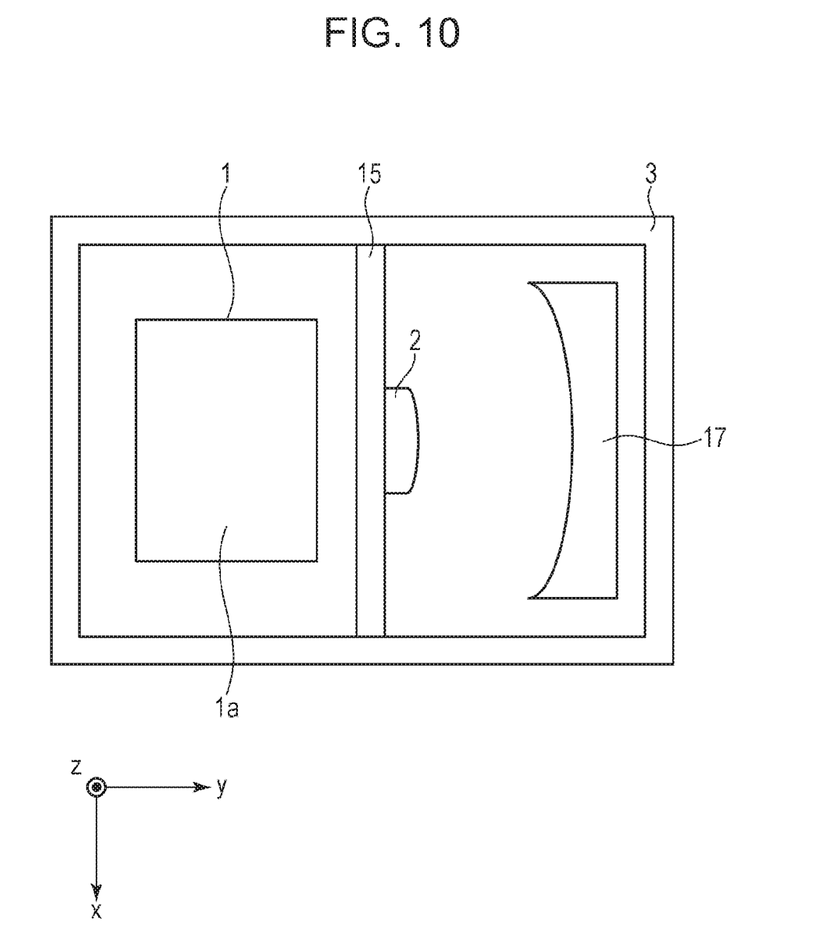
FIG. 10 is a sectional view of a projection optical system according to the related art.

The convex mirror 2 is provided with a supporting member 15 that supports the convex mirror 2. FIG. 10 is a sectional view of the projection optical system taken along an x-y plane. The supporting member 15 is a beam-like member provided between the polygonal optical member 1 and the concave mirror 17 and extending in the x direction that is perpendicular to the optical axes of the convex mirror 2 and the concave mirror 17. The supporting member 15 supports a side of the convex mirror 2 that is opposite a reflecting surface of the convex mirror 2. Two ends of the supporting member 15 are supported by respective supporting surfaces of the lens barrel 3.

Figure 11:
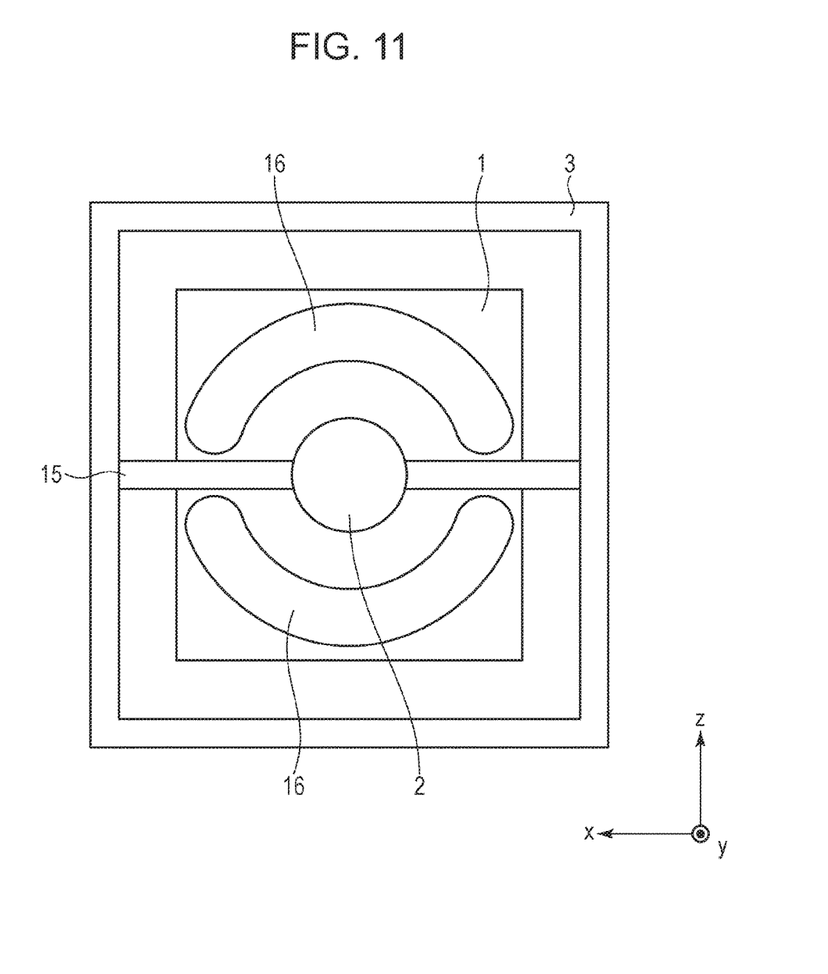
FIG. 11 is a plan view of the projection optical system according to the related art that is seen from the side of a concave mirror.

The illumination optical system IL emits a beam of illuminating light whose cross section has an arc shape with a predetermined width, and illuminates the mask 18 within an arc-shaped illuminating area. Therefore, the areas of the first reflecting surface 1a, the first concave reflecting surface 17a, the convex mirror 2, the second concave reflecting surface 17b, and the second reflecting surface 1b that are to be illuminated each also have an arc shape of a predetermined size. FIG. 11 is a plan view of the projection optical system that is seen from the side of the concave mirror 17. As illustrated in FIG. 11, the convex mirror 2 is surrounded by arc-shaped beam areas 16. The supporting member 15 is positioned between the beam area 16 on the upper side and the beam area 16 on the lower side.

If the area of the mask 18 that is to be illuminated is widened or the incident angle of the light to be taken into the projection optical system is increased for the purpose of improving the resolution or the throughput, the path of the light beam in the projection optical system is also widened. The path of the light beam in that case is illustrated by dotted lines in FIG. 9. As illustrated by the dotted lines in FIG. 9, the light beam reflected by the polygonal optical member 1 overlaps the supporting member 15 that supports the convex mirror 2, and the overlapped portion of the light beam is blocked or reflected by an upper portion A of the supporting member 15. Consequently, favorable imaging performance cannot be provided.

To avoid such an eclipse of the light beam by the supporting member 15, the size of the projection optical system, including the sizes of the polygonal optical member 1, the convex mirror 2, and the lens barrel 3, may be increased. However, the increase in the size of the projection optical system leads to an increase in manufacturing costs and an increase in the installation space. Moreover, the sizes of the polygonal optical member 1 and the convex mirror 2 increase, and the weights of the polygonal optical member 1 and the convex mirror 2 increase correspondingly. Hence, the eigenvalues (natural frequencies) of the polygonal optical member 1 and the convex mirror 2 are lowered. If the eigenvalues are lowered, the amplitude of vibration due to disturbance, if any, becomes large. Accordingly, the change in the position of the image plane of the projection optical system increases, the imaging performance in the exposure process performed on the substrate changes periodically and significantly, and the pattern projected on the substrate is distorted. Consequently, the resulting pattern formed on the substrate may have defects or include lines whose widths are nonuniform.

CITATION LIST

Patent Literature

PTL 1: Japanese Patent Laid-Open No. 2014-103171

SUMMARY OF INVENTION

Solution to Problem

According to an aspect of the present invention, there is provided a projection optical system that projects an image of an object onto an image plane. The projection optical system includes an imaging optical system including a first concave mirror, a convex mirror, and a second concave mirror; an optical member having a first reflecting surface and a second reflecting surface each redirecting an optical path; and a supporting member that supports the convex mirror. The first reflecting surface, the first concave mirror, the convex mirror, the second concave mirror, and the second reflecting surface are provided in that order in a direction of travel of light from an object plane. The optical member has a through hole having an opening on a side facing the convex mirror. The supporting member extends through the through hole and from the opening to the convex mirror.

Further features of the present invention will become apparent from the following description of exemplary embodiments with reference to the attached drawings.

DESCRIPTION OF EMBODIMENTS

Embodiments of the present invention will now be described with reference to the drawings.

First Embodiment

Figure 1:
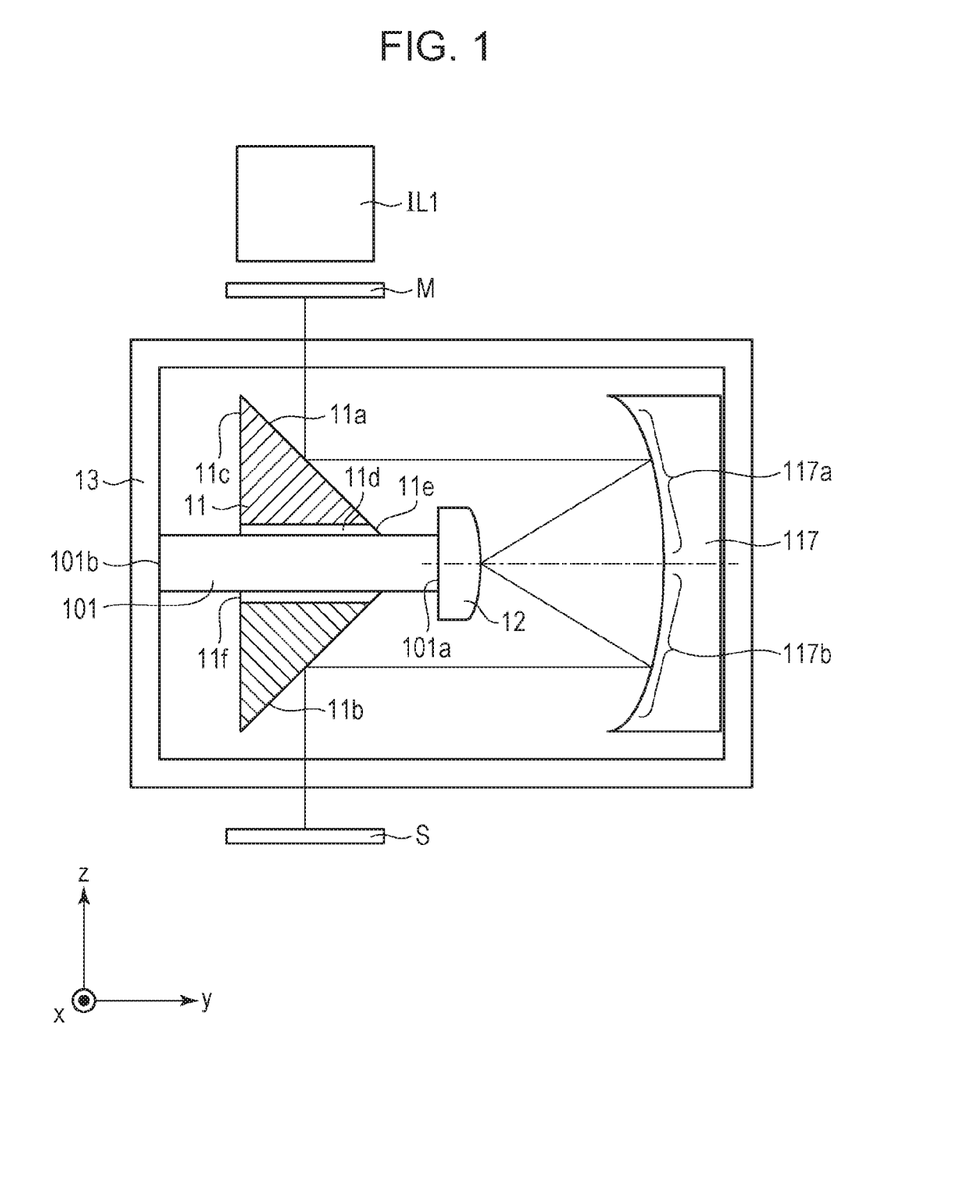
FIG. 1 is a schematic diagram of an exposure apparatus according to a first embodiment of the present invention.

FIG. 1 is a schematic diagram of an exposure apparatus according to a first embodiment of the present invention that includes a projection optical system. The exposure apparatus according to the first embodiment projects an image of a pattern drawn on a mask M onto a glass substrate S, to which photoresist has been applied, while moving the mask M and the substrate S in the y direction, thereby performing exposure on the substrate S. The exposure apparatus includes an illumination optical system IL1 that illuminates the mask M, and a projection optical system that projects the pattern drawn on the mask M onto the substrate S. The projection optical system includes a polygonal optical member 11 (an optical member) having a first reflecting surface 11a and a second reflecting surface 11b, a concave mirror 117 having a first concave reflecting surface 117a and a second concave reflecting surface 117b, and a convex mirror 12. The first concave reflecting surface 117a, the second concave reflecting surface 117b, and the convex mirror 12 constitute an imaging optical system that focuses an image of the pattern drawn on the mask M (an object plane) upon the substrate S (an image plane). The concave mirror 117 and the convex mirror 12 share a common optical axis, which is illustrated by a dotted-chain line extending in the y direction. The projection optical system further includes a lens barrel 13 that houses the above mirrors.

The polygonal optical member 11 is a member whose y-z section has a triangular or trapezoidal shape. The polygonal optical member 11 is an optical member having a plurality of flat surfaces including the first reflecting surface 11a, the second reflecting surface 11b, and a surface 11c. The first reflecting surface 11a and the second reflecting surface 11b of the polygonal optical member 11 are each provided with a reflecting film and each have a function of reflecting incoming light and thus redirecting the optical path of the light. The polygonal optical member 11 according to the first embodiment has a through hole 11d. The through hole 11d extends in the y direction and has an opening 11e on the side facing the convex mirror 12 and an opening 11f on the side facing the lens barrel 13 that is opposite the side facing the convex mirror 12.

Light emitted from the illumination optical system IL1 in the −z direction is transmitted through the mask M and is redirected in the +y direction by the first reflecting surface 11a of the polygonal optical member 11, which is positioned below the mask M. The light thus redirected by the first reflecting surface 11a of the polygonal optical member 11 is reflected by the first concave reflecting surface 117a, the convex mirror 12, the second concave reflecting surface 117b, and the second reflecting surface 11b in that order and falls onto the substrate S. That is, the first reflecting surface 11a, the first concave reflecting surface 117a, the convex mirror 12, the second concave reflecting surface 117b, and the second reflecting surface 11b are provided in that order in the direction of travel of the light from the object plane.

The convex mirror 12 is provided with a supporting member 101 that supports the convex mirror 12. The supporting member 101 is a beam-like member extending in the y direction, which is parallel to the optical axis of the imaging optical system. The supporting member 101 extends through the through hole 11d of the polygonal optical member 11. The inside diameter of the through hole 11d of the polygonal optical member 11 is larger than the outside diameter of the supporting member 101. Hence, the supporting member 101 is not in contact with the polygonal optical member 11. The supporting member 101 extends, at least between the polygonal optical member 11 and the convex mirror 12, from the opening 11e provided on the side facing the convex mirror 12 to the convex mirror 12. The supporting member 101 supports, by a supporting surface 101a at one end thereof, the convex mirror 12 or a member holding the convex mirror 12, with a supported surface 101b at the other end thereof supported by the lens barrel 13. Thus, the supporting member 101 forms a cantilever supported only at the supported surface 101b thereof. The supporting member 101 supports a side of the convex mirror 12 that is opposite a reflecting surface of the convex mirror 12.

As described above, the supporting member 101 is provided outside an optical path extending from the first reflecting surface 11a to the first concave reflecting surface 117a and an optical path extending from the second concave reflecting surface 117b to the second reflecting surface 11b and on the side of the convex mirror 12 that is opposite the reflecting surface of the convex mirror 12 so that the supporting member 101 does not overlap the optical paths. Therefore, even if the beam area (beam passing area) in the projection optical system is widened, the supporting member 101 does not block or reflect the light beam. Hence, even if the beam area in the projection optical system is widened with no increase in the size of the projection optical system, the favorable imaging performance of the projection optical system can be maintained.

Furthermore, since the first embodiment does not employ the supporting member 15 employed in the related art, there is no need to provide a gap between the arc-shaped beam areas 16 illustrated in FIG. 11. That is, providing a gap between the arc-shaped beam areas 16 is not included in design restrictions. Hence, the first embodiment is beneficial in terms of the design of the projection optical system. Therefore, even if the polygonal optical member 11 and the convex mirror 12 are of the same sizes as those employed in the related art, a light beam at a larger incident angle (numerical aperture, or NA) can be taken into the projection optical system or the beam area in the projection optical system can be widened.

When the projection optical system is seen from the side of the concave mirror 117 (the first concave reflecting surface 117a or the second concave reflecting surface 117b), a portion of the supporting member 101 that extends between the convex mirror 12 and the polygonal optical member 11 can be shaped such that the outer circumference of the portion is on the inner side of the outer circumference of the convex mirror 12 or the member holding the convex mirror 12. In such a configuration, the supporting member 101 can be assuredly prevented from blocking the optical path in the projection optical system.

The convex mirror 12 and the supporting member 101 can be fixed to each other with adhesive, a compression spring, or the like. Fixing with adhesive is superior in that the shape of the reflecting surface of the convex mirror 12 is less likely to be distorted because the adhesive is hardened while the shape of the reflecting surface of the convex mirror 12 is retained. Fixing with a compression spring is superior in that the fixing work can be done in a short time, that is, the fixing work is easy, because there is no need to wait for the adhesive to be hardened.

The supporting member 101 can be made of steel, fiber-reinforced plastic (FRP), or the like. Steel is less expensive than FRP and is superior in ease of processing. FRP has a higher stiffness per weight than steel and is superior in that the eigenvalue (natural frequency) of the supporting member 101 can be made high and the amplitude of vibration of the convex mirror 12 can be thus reduced.

The supporting member 101 may be a hollow body. If the supporting member 101 is a hollow body, the supporting member 101 can have a light weight and a high dynamic stiffness. Furthermore, if temperature-conditioned air is fed into the hollow of the supporting member 101, the temperature of the convex mirror 12 becomes controllable. Thus, the imaging performance of the projection optical system can be improved.

The through hole 11d of the polygonal optical member 11 is provided at a position excluding areas of the polygonal optical member 11 to which the light beam is applied. Note that the diameter of the through hole 11d can be made as large as possible at a position excluding the areas to which the light beam is applied. If the diameter of the through hole 11d is made large, the diameter of the supporting member 101 to be inserted into the through hole 11d can be made large. Accordingly, the stiffness of the supporting member 101 can be increased.

Second Embodiment

Figure 2:
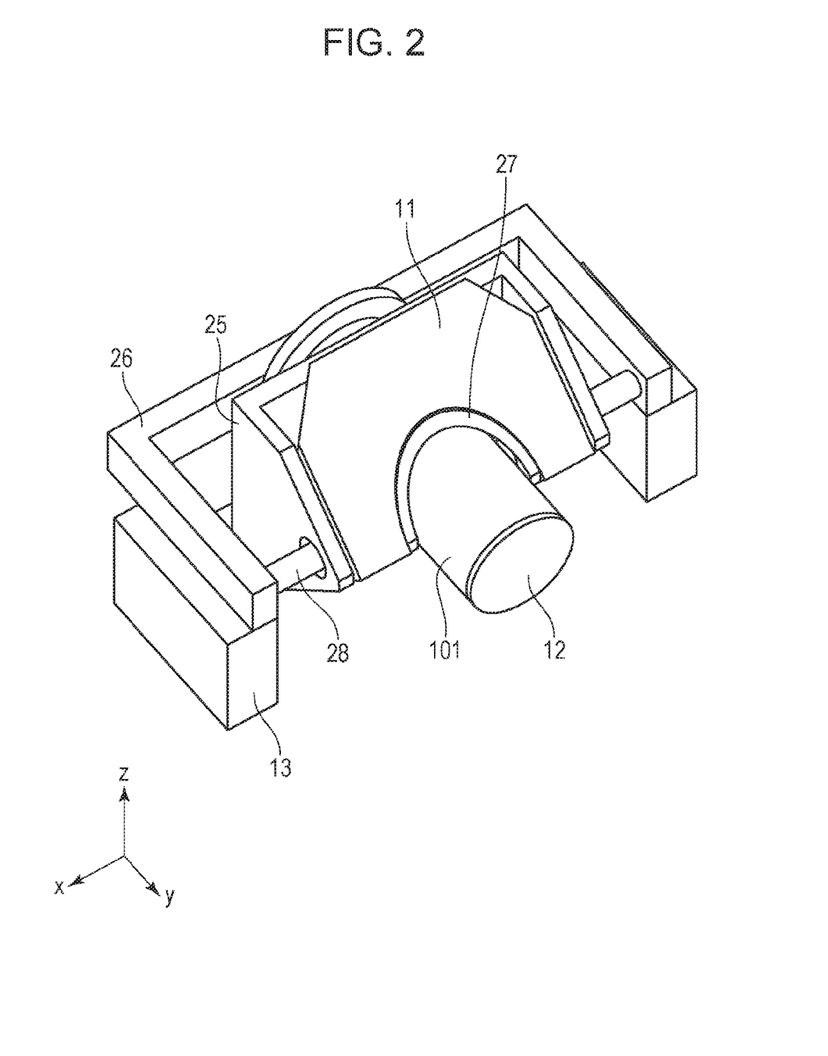
FIG. 2 is a schematic diagram of a projection optical system according to a second embodiment of the present invention, illustrating a polygonal optical member, a convex mirror, and peripheral elements.
Figure 3:
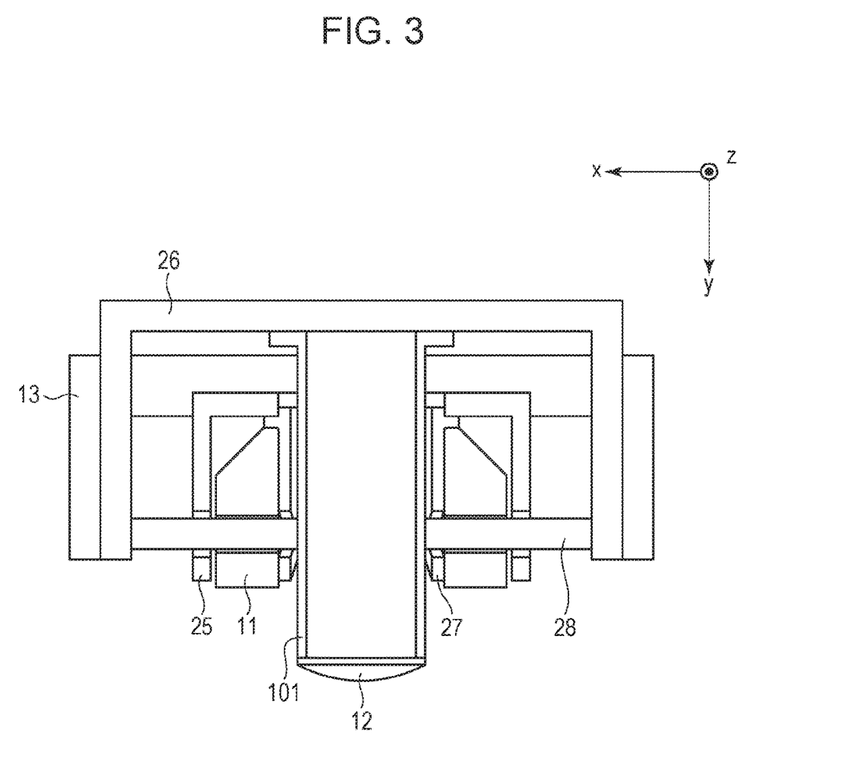
FIG. 3 is a sectional view of the projection optical system illustrated in FIG. 2 that is taken along an x-y plane.

FIG. 2 is a schematic diagram of a projection optical system according to a second embodiment of the present invention, illustrating the polygonal optical member 11, the convex mirror 12, and peripheral elements. FIG. 3 is a sectional view of the projection optical system illustrated in FIG. 2 that is taken along an x-y plane. The projection optical system according to the second embodiment includes the polygonal optical member 11 that is the same as that of the first embodiment, a supporting frame 25 that supports the polygonal optical member 11, a supporting frame 26 that supports the supporting member 101, a holding member 27 that holds the polygonal optical member 11, and a supporting shaft 28 that supports the supporting member 101.

The holding member 27 that holds the polygonal optical member 11 is in contact with the inner circumference of the through hole 11d provided in the polygonal optical member 11 and surrounds the outer circumference of the supporting member 101. The inside diameter of the holding member 27 is larger than the outside diameter of the supporting member 101. Hence, the holding member 27 is not in contact with the supporting member 101. The holding member 27 is connected to the supporting frame 25. The supporting frame 25 is connected to the lens barrel 13. Thus, the polygonal optical member 11 is supported by the lens barrel 13 with the aid of the holding member 27 and the supporting frame 25.

The supporting member 101 is connected to the supporting frame 26. The supporting frame 26 is connected to the lens barrel 13. Thus, the convex mirror 12 is supported by the lens barrel 13 with the aid of the supporting member 101 and the supporting frame 26.

The supporting shaft 28 extends through through holes provided in the side faces of the polygonal optical member 11, through holes provided in the supporting frame 25, and through holes provided in the holding member 27. Thus, the supporting shaft 28 connects the supporting member 101 and the supporting frame 26 to each other. That is, the supporting shaft 28 serves as an additional supporting member that supports the supporting member 101, with a point between two ends of the supporting member 101 acting as a fulcrum.

If the supporting shaft 28 is not provided, the supporting member 101 forms a cantilever to the tip of which the convex mirror 12 is attached. In such a configuration, the natural frequency of the supporting member 101 is lowered. Providing the supporting shaft 28 makes it possible to support the supporting member 101 at a position near the convex mirror 12. In such a configuration, the supporting member 101 forms a beam supported at the two ends thereof. Hence, the natural frequency of the supporting member 101 becomes high. Moreover, since the supporting shaft 28 extends through the openings provided in the side faces of the polygonal optical member 11, there is no chance that the supporting shaft 28 may interfere with the light beam traveling in the projection optical system.

Third Embodiment

Figure 4:
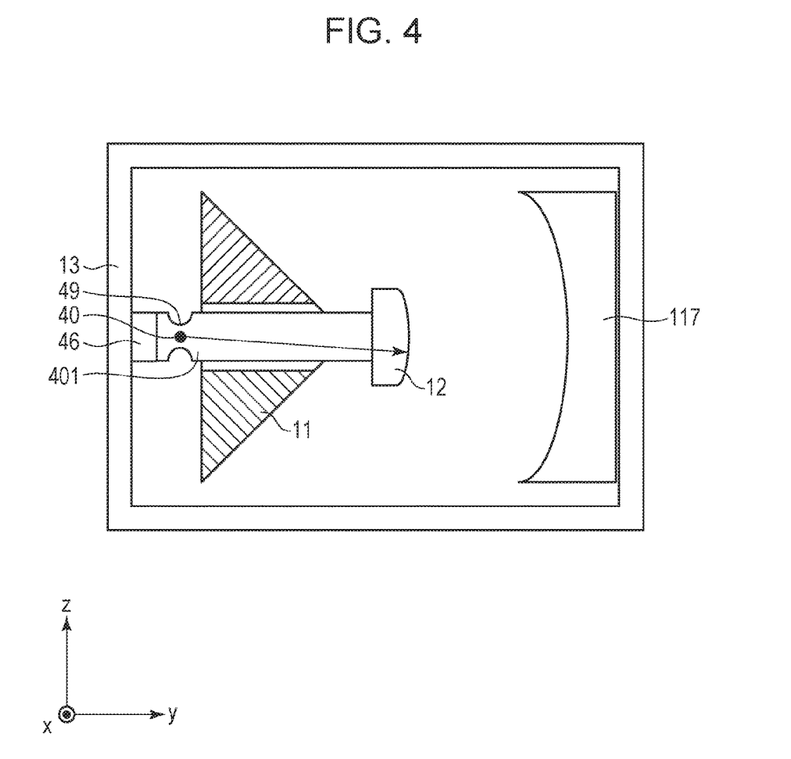
FIG. 4 is a schematic diagram of a projection optical system according to a third embodiment of the present invention.

FIG. 4 is a schematic diagram of a projection optical system according to a third embodiment of the present invention. The projection optical system according to the third embodiment includes the polygonal optical member 11 that is the same as that of the first embodiment, a supporting member 401 provided as a substitute for the supporting member 101 and that supports the convex mirror 12, and a supporting member 46 that supports the supporting member 401.

As in the first embodiment, the supporting member 401 extends in the y direction through the through hole provided in the polygonal optical member 11 and supports the convex mirror 12 at the tip thereof. The inside diameter of the through hole provided in the polygonal optical member 11 is larger than the outside diameter of the supporting member 401. Hence, the supporting member 401 is not in contact with the polygonal optical member 11. Unlike the supporting member 101 according to the first embodiment, the supporting member 401 includes a less-stiff portion 49 near a center of curvature 40 of the reflecting surface of the convex mirror 12. Specifically, the less-stiff portion 49 is a ring-shaped recess having a reduced diameter.

The supporting member 401 forms a cantilever one end of which is fixed to the supporting member 46. The supporting member 46 is made of a material having a low stiffness. The supporting member 401 including the less-stiff portion 49 has a lower stiffness at the center of curvature 40 of the reflecting surface of the convex mirror 12 than at the other positions excluding the center of curvature 40.

On the other hand, the exposure apparatus includes stages that move the mask M and the substrate S, respectively. Disturbance such as reaction forces generated when the stages are driven and vibrations transmitted from the floor on which the exposure apparatus is installed may vibrate the supporting member 401. Vibrations of the supporting member 401 provided in the form of a cantilever are rotational vibrations occurring in the ωX and ωZ directions around the center of curvature 40. That is, the convex mirror 12 vibrates around the center of curvature 40. Accordingly, the reflecting surface of the convex mirror 12 is only displaced within an extension of the reflecting surface, and the displacement of the convex mirror 12 in a direction normal to the reflecting surface is reduced. Hence, the deterioration in the imaging performance of the projection optical system due to the displacement of the reflecting surface of the convex mirror 12 is smaller than in the projection optical system according to the related art. According to the third embodiment, for example, the shift of an image projected onto the substrate S is reduced, and the distortion in the image of the pattern projected on the substrate S is therefore reduced. Consequently, defects in the pattern formed on the substrate S and the nonuniformity in the line width of the pattern are reduced.

The less-stiff portion 49 only needs to be less stiff. Therefore, the less-stiff portion 49 may be, instead of a recess, a structure such as an elastic hinge member or a less-stiff elastic member. The elastic hinge member is superior in that the center of rotational vibration of the supporting member 401 is easily set to the hinge portion. Examples of the less-stiff elastic member include an aluminum alloy and the like. Such a less-stiff elastic member is superior to the elastic hinge member in that the less-stiff elastic member is less likely to undergo plastic deformation at impact.

Fourth Embodiment

Figure 5:
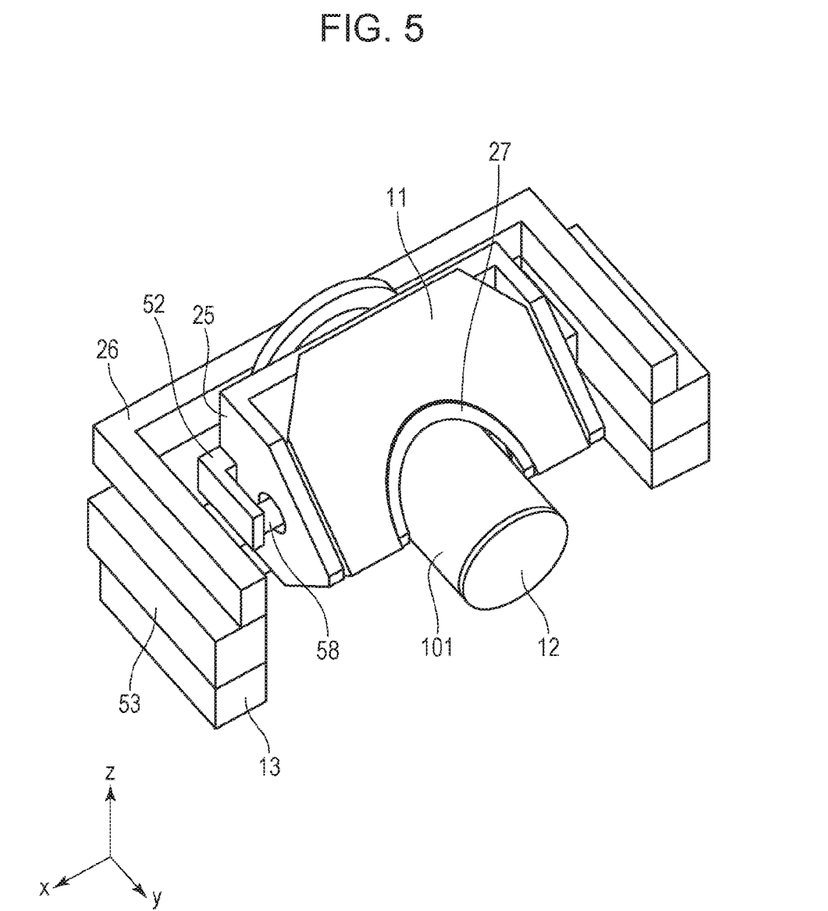
FIG. 5 is a schematic diagram of a projection optical system according to a fourth embodiment of the present invention, illustrating a polygonal optical member, a convex mirror, and peripheral elements.
Figure 6:
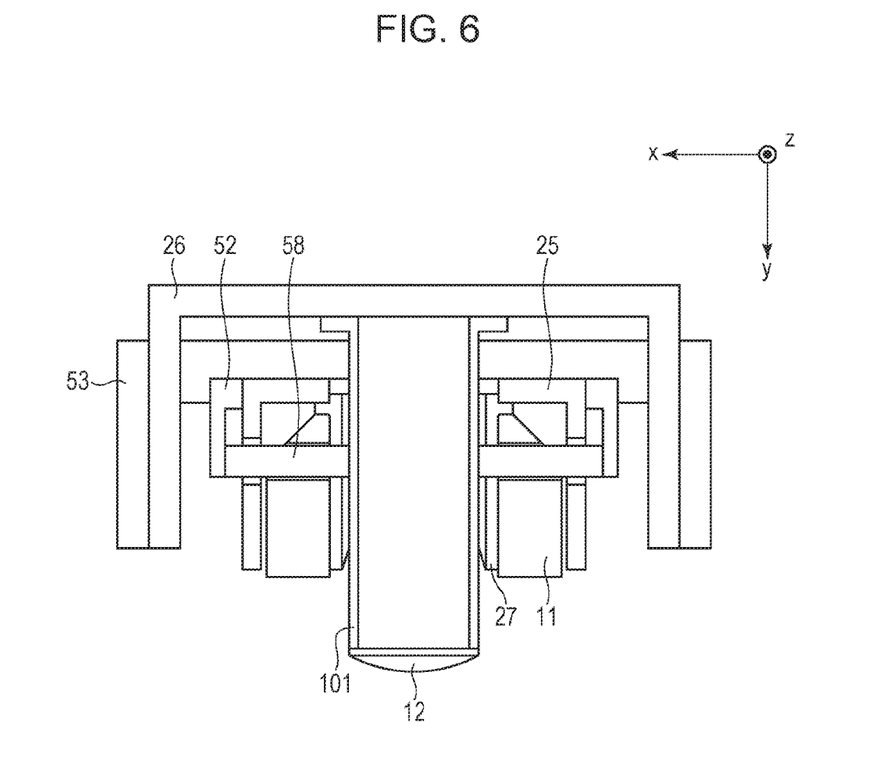
FIG. 6 is a sectional view of the projection optical system illustrated in FIG. 5 that is taken along an x-y plane.

A projection optical system according to a fourth embodiment of the present invention will now be described with reference to FIGS. 5 and 6. FIG. 5 is a schematic diagram of the projection optical system according to the fourth embodiment, illustrating the polygonal optical member 11, the convex mirror 12, and peripheral elements. FIG. 6 is a sectional view of the projection optical system illustrated in FIG. 5 that is taken along an x-y plane. The projection optical system according to the fourth embodiment includes the elements employed in the second embodiment, a driving mechanism 52 that moves the polygonal optical member 11, and a driving mechanism 53 that moves the convex mirror 12. Furthermore, the projection optical system according to the fourth embodiment includes a supporting shaft 58 as a substitute for the supporting shaft 28 employed in the second embodiment.

The driving mechanisms 52 and 53 each include a driving source such as an actuator. The actuator may be a stepping motor, a linear motor, or the like. The stepping motor is superior in being relatively inexpensive because it is a general actuator and in that position adjustment is easy because the position of an object of moving is controllable on the basis of the number of driving pulses. The linear motor is a linearly driven actuator and therefore does not require a mechanism of converting a rotational motion into a linear motion, which is required in a case where a rotary driving actuator such as a stepping motor is employed. Hence, the linear motor is superior in structural simplicity.

The holding member 27 that holds the polygonal optical member 11 has a cylindrical shape and is fitted to the through hole of the polygonal optical member 11. Thus, the polygonal optical member 11 and the holding member 27 are integrated with each other. Furthermore, the supporting member 101 extends through the bore of the holding member 27 in such a manner as not to be in contact with the holding member 27. Furthermore, the polygonal optical member 11 and the supporting frame 25 that supports the polygonal optical member 11 each have through holes in the right and left side faces, respectively, thereof, and the supporting shaft 58 connected to the holding member 27 extends through those through holes. The supporting shaft 58 extends through the polygonal optical member 11 and the supporting frame 25 in such a manner as not to be in contact therewith, that is, with a gap provided therebetween.

To adjust the focal position and the imaging performance such as astigmatism in the projection optical system, the positions of the polygonal optical member 11 and the convex mirror 12 need to be adjusted. For example, to adjust the focal position, only the position of the polygonal optical member 11 needs to be adjusted. To adjust the astigmatism, the position of the convex mirror 12 needs to be adjusted. That is, the polygonal optical member 11 and the convex mirror 12 need to be configured such that the positions thereof are adjustable independently of each other. Therefore, the fourth embodiment employs the driving mechanisms 52 and 53 provided to the polygonal optical member 11 and the convex mirror 12, respectively.

The driving mechanism 52 is provided between the supporting frame 25 and the supporting shaft 58. Activating the driving mechanism 52 enables the position of the supporting shaft 58 to be adjusted, with the supporting frame 25 that is connected to the lens barrel 13 being fixed. The supporting shaft 58 is connected to and thus integrated with the polygonal optical member 11 with the holding member 27 interposed therebetween. Therefore, the position of the polygonal optical member 11 is adjustable by the driving mechanism 52.

The driving mechanism 52 includes two driving mechanisms 52 provided on the right and left side faces, respectively, of the supporting frame 25. The right and left driving mechanisms 52 each have y and z driving axes. Hence, the polygonal optical member 11 is movable linearly in two directions along the y axis and the z axis. Moreover, if the right and left driving mechanisms 52 are driven in opposite directions, respectively, along the y axis, the polygonal optical member 11 is driven rotationally around the z axis. Furthermore, if the right and left driving mechanisms 52 are driven in opposite directions, respectively, along the z axis, the polygonal optical member 11 is driven rotationally around the y axis.

The driving mechanism 53 is provided between the lens barrel 13 and the supporting frame 26. Activating the driving mechanism 53 enables the position of the supporting frame 26 to be adjusted, with the lens barrel 13 being fixed. Thus, the position of the convex mirror 12 is adjustable by the driving mechanism 53 with the aid of the supporting frame 26 and the supporting member 101. The driving mechanism 53 includes two driving mechanisms 53 provided below the right and left side portions, respectively, of the supporting frame 26. The right and left driving mechanisms 53 each have x, y, and z driving axes. Hence, the convex mirror 12 is movable linearly in three directions along the x axis, the y axis, and the z axis.

The driving mechanisms 53 may be provided between the convex mirror 12 and the supporting member 101. In that case, Activating the driving mechanisms 53 enables the position of the convex mirror 12 to be adjusted, with the supporting member 101 being fixed. The driving mechanisms 53 each have x, y, and z driving axes. Hence, the convex mirror 12 is movable linearly in three directions along the x axis, the y axis, and the z axis. If the driving mechanisms 53 are provided between the lens barrel 13 and the supporting frame 26, the driving mechanisms 53 need to drive three elements, which are the convex mirror 12, the supporting member 101, and the supporting frame 26. In contrast, if the driving mechanisms 53 are provided between the convex mirror 12 and the supporting member 101, the driving mechanisms 53 only need to drive the convex mirror 12. Hence, the total weight of objects of driving is reduced, and the size of the driving mechanisms 53 can be therefore reduced, which is beneficial. Moreover, since the object of driving, i.e., the convex mirror 12, is driven directly, the accuracy of driving is improved, which is also beneficial.

However, if the driving mechanisms 53 are provided between the convex mirror 12 and the supporting member 101, the total weight of elements provided around the convex mirror 12 increases. Accordingly, the eigenvalue of the supporting member 101 is lowered. Thus, the case where the driving mechanisms 53 are provided between the lens barrel 13 and the supporting frame 26 is superior in that the increase in the total weight of elements provided around the convex mirror 12 is suppressed and the reduction in the eigenvalue of the supporting member 101 is prevented.

The driving mechanisms 52 and 53 may each be a manually movable mechanism that is movable by hand. The driving mechanisms 52 and 53 that are manually movable are superior in being simple and inexpensive. Such manually movable driving mechanisms 52 and 53 are also superior in that, since no heat source such as an actuator is provided, there is no chance of deterioration in the imaging performance of the projection optical system due to heat generation.

The driving mechanisms 52 and 53 are both provided at positions in the projection optical system that are far from the light beam. Hence, there is no chance that the driving mechanisms 52 and 53 may interfere with the light beam.

Fifth Embodiment

Figure 7:
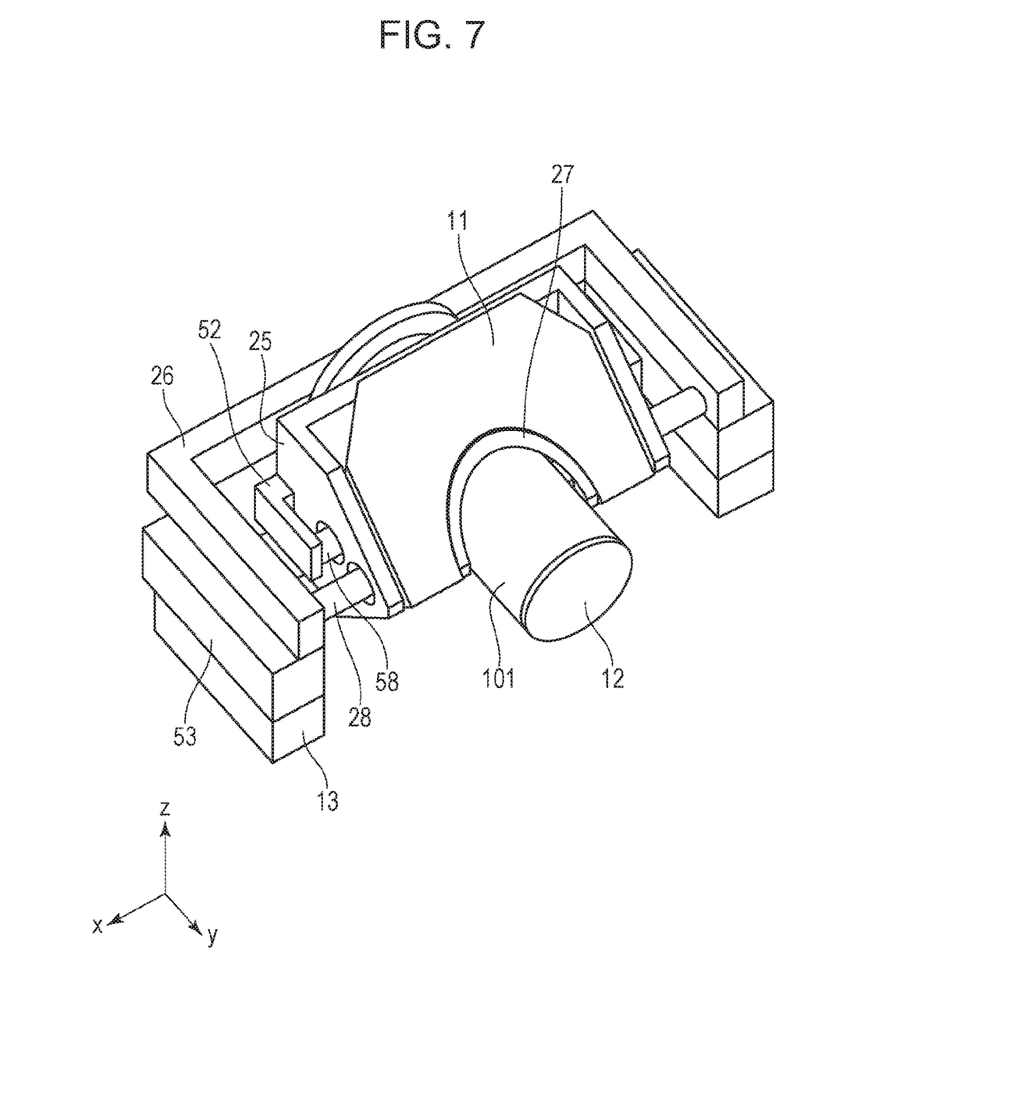
FIG. 7 is a schematic diagram of a projection optical system according to a fifth embodiment of the present invention, illustrating a polygonal optical member, a convex mirror, and peripheral elements.

FIG. 7 is a schematic diagram of a projection optical system according to a fifth embodiment of the present invention, illustrating the polygonal optical member 11, the convex mirror 12, and peripheral elements. The projection optical system according to the fifth embodiment employs a combination of the elements according to the second embodiment and the elements according to the fourth embodiment. The projection optical system according to the fifth embodiment includes the polygonal optical member 11, the supporting frame 25 that supports the polygonal optical member 11, the supporting frame 26 that supports the supporting member 101, the holding member 27 that holds the polygonal optical member 11, the supporting shaft 28 that supports the supporting member 101, the driving mechanism 52 that moves the polygonal optical member 11, the driving mechanism that moves the convex mirror 12, and the supporting shaft 58.

The supporting shafts 28 and 58 each extend through the through holes provided in the side faces of the polygonal optical member 11 in such a manner as not to be in contact with the polygonal optical member 11 with a gap interposed therebetween. The polygonal optical member 11 and the convex mirror 12 are moved independently of each other and relative to each other by the respective driving mechanisms 52 and 53. Hence, the gap between the supporting shaft 28 and the polygonal optical member 11 is set to a size that is larger than or equal to the length of movement of the polygonal optical member 11 and the convex mirror 12 relative to each other.

The supporting shafts 28 and 58 each extend through the through holes provided in the side faces of the polygonal optical member 11. Hence, there is no chance that the supporting shafts 28 and 58 may interfere with the light beam traveling in the projection optical system.

Sixth Embodiment

Figure 8:
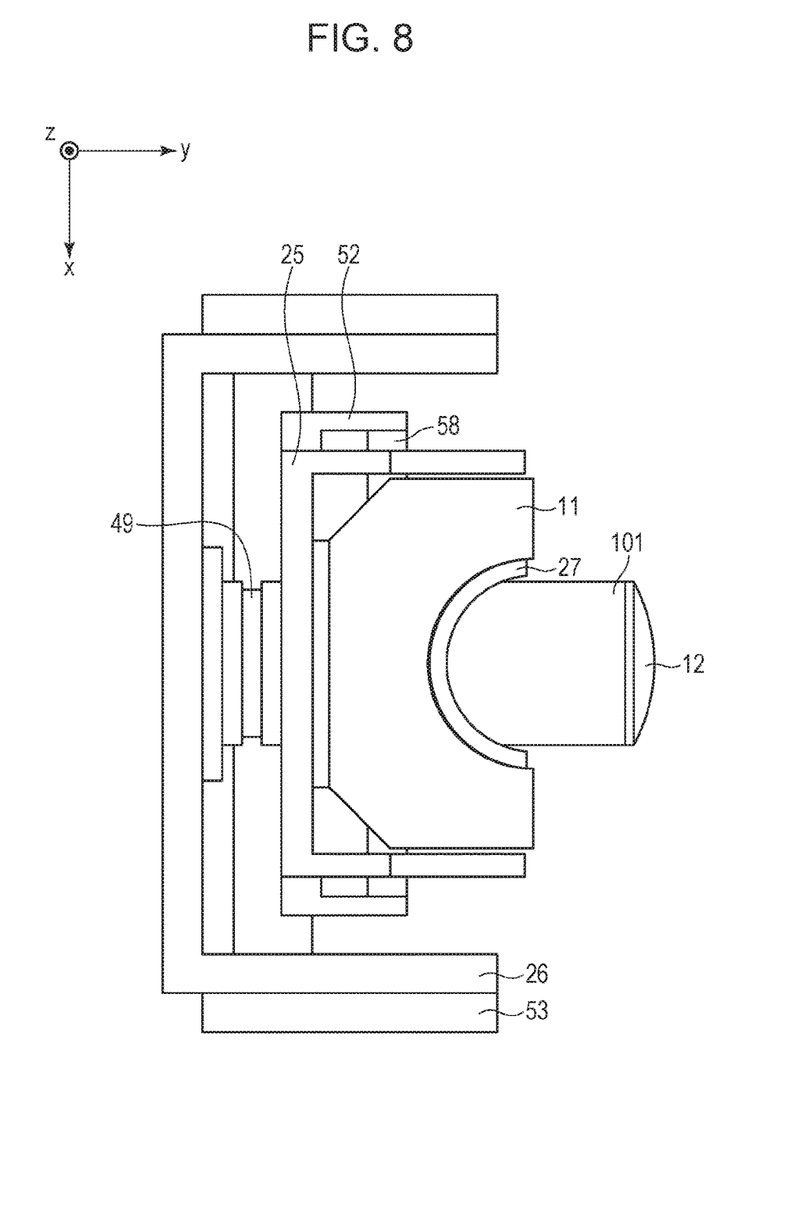
FIG. 8 is a schematic diagram of a projection optical system according to a sixth embodiment of the present invention, illustrating a polygonal optical member, a convex mirror, and peripheral elements.

FIG. 8 is a schematic diagram of a projection optical system according to a sixth embodiment of the present invention, illustrating the polygonal optical member 11, the convex mirror 12, and peripheral elements. The projection optical system according to the sixth embodiment employs a combination of the elements according to the fourth embodiment and the less-stiff portion 49 according to the third embodiment. The projection optical system according to the sixth embodiment includes the polygonal optical member 11, the supporting frame 25 that supports the polygonal optical member 11, the supporting frame 26 that supports the supporting member 101, the holding member 27 that holds the polygonal optical member 11, the driving mechanism 52 that moves the polygonal optical member 11, the supporting shaft 58, the driving mechanism 53 that moves the convex mirror 12, and the less-stiff portion 49. The less-stiff portion 49 is provided in the form of a ring-shaped recess having a reduced diameter.

The supporting member 101 extends through the bore of the holding member 27 in such a manner as not to be in contact with the holding member 27 with a gap interposed therebetween. Hence, vibrations due to disturbance may cause the supporting member 101 to vibrate in such a manner as to rotate around the center of curvature of the convex mirror 12. Such a configuration produces the effect of reducing the displacement in the reflecting surface of the convex mirror 12 and thus reducing the shift of an image projected on the substrate S.

As described above, according to each of the above embodiments, even if the beam area in the projection optical system is widened with no increase in the size of the projection optical system, the light beam is prevented from being eclipsed by the supporting member 101 or 401 that supports the convex mirror 12. Thus, a projection optical system in which favorable imaging performance is maintained is provided.

While several embodiments of the present invention have been described above, the present invention is not limited to the above embodiments. Many changes and modifications can be made to the present invention within the scope of the present invention. For example, while the concave mirror 117 is a single member having the first concave reflecting surface 117a and the second concave reflecting surface 117b, the concave mirror 117 may be changed to two members that are independent of each other: specifically, a concave mirror having the first concave reflecting surface 117a, and a concave mirror having the second concave reflecting surface 117b. The configuration of the supporting member 101 or 401 that supports the convex mirror 12 is not limited to those described in the above embodiments. The supporting member 101 or 401 only needs to be a member that does not block or reflect the light beam traveling in the projection optical system even if the beam area in the projection optical system is widened. For example, the supporting member 101 or 401 that supports the convex mirror 12 may be a curved beam, a T-shaped member, or the like.

Seventh Embodiment

A method of manufacturing a device (a semiconductor integrated-circuit device, a liquid-crystal display device, or the like) by using the above exposure apparatus will now be described. The device is manufactured through the following steps: a step of performing exposure by using the above exposure apparatus upon a substrate (a wafer, a glass substrate, or the like) to which photoresist has been applied, a step of developing the substrate (the photoresist), and other known steps. The other known steps include etching, resist stripping, dicing, bonding, packaging, and so forth. By the device manufacturing method according to the seventh embodiment, a device of higher quality than in the related art can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-244333, filed Dec. 2, 2014, which is hereby incorporated by reference herein in its entirety.

The invention claimed is:

1. A projection optical system that projects an image of an object onto an image plane, the projection optical system comprising:
an imaging optical system including a concave mirror and a convex mirror, the concave mirror having a first concave reflecting surface and a second concave reflecting surface;
an optical member having a first reflecting surface and a second reflecting surface each redirecting an optical path; and
a supporting member that supports the convex mirror;
wherein the first reflecting surface, the first concave reflecting surface, the convex mirror, the second concave reflecting surface, and the second reflecting surface are provided in that order in a direction of travel of light from an object plane, and
wherein the supporting member extends through an opening of the optical member on a side thereof facing the convex mirror, and wherein the opening is a through hole.

2. The projection optical system according to claim 1, wherein the opening is positioned between the first reflecting surface and the second reflecting surface.

3. The projection optical system according to claim 1, wherein the supporting member extends from the opening to a side of the convex mirror that is opposite a reflecting surface of the convex mirror.

4. The projection optical system according to claim 1, wherein a portion of the supporting member that extends between the convex mirror and the optical member extends from a side of the convex mirror that is opposite a reflecting surface of the convex mirror and in a direction parallel to an optical axis of the convex mirror.

5. The projection optical system according to claim 1, wherein, when the projection optical system is seen from a side of the first concave reflecting surface or the second concave reflecting surface, a portion of the supporting member that extends between the convex mirror and the optical member is shaped such that an outer circumference of the portion is on an inner side of an outer circumference of the convex mirror.

6. The projection optical system according to claim 1, wherein the supporting member is a cantilever.

7. The projection optical system according to claim 1, further comprising an additional supporting member that supports the supporting member with a point between two ends of the supporting member acting as a fulcrum.

8. The projection optical system according to claim 1, wherein the supporting member has a lower stiffness at a position corresponding to a center of curvature of the convex mirror than at other positions excluding the center of curvature.

9. The projection optical system according to claim 1,
wherein the concave mirror includes a first concave mirror having the first concave reflecting surface and a second concave mirror having the second concave reflecting surface,
wherein the optical member is polygonal optical member having a plurality of flat surfaces including at least the first reflecting surface and the second reflecting surface, and
wherein the first concave reflecting surface is arranged opposite to the first reflecting surface of the optical member, and the second concave reflecting surface is arranged opposite to the second reflecting surface of the optical member.

10. The projection optical system according to claim 1, wherein the supporting member extends opposite to the side of the convex mirror opposite to the optical member and supports the concave mirror with respect to a lens barrel of the projection optical system.

11. The projection optical system according to claim 1, wherein the supporting member extends through the through hole without contacting the optical member.

12. The projection optical system according to claim 1, further comprising a driving mechanism that drives the optical member.

13. The projection optical system according to claim 1, further comprising a driving mechanism that drives the convex mirror.

14. An exposure apparatus comprising:
an illumination optical system that illuminates a mask; and
a projection optical system that projects a pattern drawn on the mask onto a substrate,
wherein the projection apparatus comprising:
an imaging optical system including a concave mirror and a convex mirror, the concave mirror having a first concave reflecting surface and a second concave reflecting surface;
an optical member having a first reflecting surface and a second reflecting surface each redirecting an optical path; and
a supporting member that supports the convex mirror;

wherein the first reflecting surface, the first concave reflecting surface, the convex mirror, the second concave reflecting surface, and the second reflecting surface are provided in that order in a direction of travel of light from an object plane, and wherein the supporting member extends through an opening of the optical member on a side thereof facing the convex mirror, and wherein the opening is a through hole.

15. A device manufacturing method comprising:

performing exposure, by using an exposure apparatus including an illumination optical system that illuminates a mask and a projection optical system that projects an image of an object onto an image plane, upon the substrate while projecting the pattern drawn on the mask onto the substrate;

developing the substrate subjected to the exposure; and processing the developed substrate into a device to manufacture the device, wherein the projection optical system comprising:

an imaging optical system including a concave mirror and a convex mirror, the concave mirror having a first concave reflecting surface and a second concave reflecting surface;

an optical member having a first reflecting surface and a second reflecting surface each redirecting an optical path; and a supporting member that supports the convex mirror;

wherein the first reflecting surface, the first concave reflecting surface, the convex mirror, the second concave reflecting surface, and the second reflecting surface are provided in that order in a direction of travel of light from an object plane, and wherein the supporting member extends through an opening of the optical member on a side thereof facing the convex mirror, and wherein the opening is a through hole.

* * * * *